United States Patent
Hsu et al.

(10) Patent No.: US 6,576,540 B2
(45) Date of Patent: Jun. 10, 2003

(54) METHOD FOR FABRICATING SUBSTRATE WITHIN A NI/AU STRUCTURE ELECTROPLATED ON ELECTRICAL CONTACT PADS

(75) Inventors: Shih-Ping Hsu, TaoYuan (TW);
Chiang-Du Chen, Taipei (TW);
Yen-Hung Liu, TaoYuan (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 10/104,976

(22) Filed: Mar. 22, 2002

(65) Prior Publication Data

US 2002/0190378 A1 Dec. 19, 2002

(30) Foreign Application Priority Data

Jun. 19, 2001 (TW) .......................... 90114792 A

(51) Int. Cl.⁷ .............................................. H01L 21/44
(52) U.S. Cl. ....................... 438/612; 438/613; 438/652; 438/671; 438/686
(58) Field of Search ................................ 438/652, 669, 438/671, 686, 612–614, 617

(56) References Cited

U.S. PATENT DOCUMENTS 5,508,229 A * 4/1996 Baker ........................ 438/614
5,565,379 A * 10/1996 Baba ......................... 438/614
5,946,590 A * 8/1999 Satoh ........................ 438/613

* cited by examiner

Primary Examiner—Carl Whitehead, Jr.
Assistant Examiner—Thanh Nguyen

(57) ABSTRACT

The present invention discloses a substrate within a Ni/Au structure electroplated on electrical contact pads and a method for fabricating the same. The method comprises: providing a substrate with a circuit layout pattern and forming a conducting film on the surface of the substrate; depositing a first photoresist layer within an opening on said electrical conducting film surface to expose a portion of said circuit layout pattern to be electrical contact pads; removing the exposed conducting film uncovered by the first photoresist layer; depositing a second photoresist layer, covering the conducting film exposed in the openings of the first photoresist layer; electroplating Ni/Au covering the surface of the electrical contact pads; removing the first and second photoresists, and the conducting film covered by the photoresists; depositing solder mask on the substrate within an opening to expose said electrical contact pads. It improves the electrical coupling between gold wires and the electrical contact pads of the substrate, prevents the electrical contact pads from oxidation, and insurances the electrical interconnection performance.

5 Claims, 6 Drawing Sheets

METHOD FOR FABRICATING SUBSTRATE WITHIN A NI/AU STRUCTURE ELECTROPLATED ON ELECTRICAL CONTACT PADS

BACKGROUND OF THE INVENTION

1. Field of the Invention

The present invention relates to a substrate within a Ni/Au structure electroplated on the electrical contact pads and a method for fabricating the same.

2. Description of the Prior Art

To catch the downsize trend of the electronics technology development, some issues have impacted the progress of substrates for integrated circuits (IC) packaged. On the surface of the substrate, electrical contact pads connected to a plurality of conducting wires is formed for the transmission of electronic signals or power. On the top surface of the electrical contact pads, a metal Ni/Au layer is formed. Some electrical contact pads, also known as bonding pads, of a substrate are covered with a Ni/Au layer on the surface. During the wire-bonding process, the metal wires and the bonding pads are all made of gold, resulting in excellent electrical coupling. Furthermore, other electrical contact pads of a substrate, solder ball pads for example, are covered with a Ni/Au layer electroplated on the surface, so that the conducting pads (usually made of copper composition) of the solder ball pads can be prevented from oxidation to improve the electrical interconnection performance of the solder ball pads.

Illustrated as FIG. 1, wherein a schematic diagram showing a Ni/Au structure electroplated on electrical contact pads of a substrate in the prior art. On the substrate 1, there are formed an upper circuit layout pattern 11, a lower circuit layout pattern 12, a plurality of plated through holes 13 or blind vias. Photolithography and etching are employed to define a circuit layout pattern with a plurality of electrical contact pads 10 (such as bonding pads or solder ball pads). Furthermore, there is a solder mask 14 to prevent soldering on the top surface of the substrate 1.

Even though the electrical contact pads 10 on the substrate 1 is disclosed to have a Ni/Au structure 16 electroplated. However, to obtain such a structure, it is required to dispose a plurality of conducting wires 15 for electroplating. Those conducting wires 15 are used to assist the electroplating process for forming the Ni/Au structure 16 electroplated on the electrical contact pads 10. Accordingly, a Ni/Au structure 16 is electroplated on the electrical contact pads 10, however a large amount of area will be occupied by the plurality of conducting wires, leading to reduce area for circuit layout pattern. In addition, noise due to the antenna effect when the conducting wires are employed may occur at high frequency. Even though etch-back can be used to remove the conducting wires 15, some residual may be left. Therefore, some residual are left leading to the antenna effect when a Ni/Au structure electroplated on the electrical contact pads of the substrate. Unfortunately, It still exists some defects in this issue such as reduced circuit layout area and noise generated at high frequency.

To overcome the problems stated above, the other method has been provided to improve the prior art, which is also referred to as Gold Pattern Plating (GPP). Illustrated as FIG. 2A to FIG. 2D, which shows the GPP process for electroplating a Ni/Au structure.

First, an electrically conducting layer 21 is formed on each surface of a substrate 2, illustrated as FIG. 2A, where a plurality of contact holes or blind vias will be formed.

A photoresist layer 22 is deposited on each of the electrically conducting layer 21 on the substrate 2, where there are a plurality of openings in the photoresist layer 22 to expose some regions, wherein the Ni/Au layer 23 is formed by electroplating method, illustrated as FIG. 2B.

Thereafter, the photoresist layers 22 are removed and the Ni/Au layer 23 still exists on the conducting layer 21, illustrated as FIG. 2C.

Finally, the Ni/Au layer 23 is used as a mask to define the electrical conducting layer 21 to form a circuit layout pattern 25 by photolithography and etching technology, wherein a Ni/Au layer 23 electroplated on the circuit layout pattern, illustrated as FIG. 2D. The other description drawing of the product illustrated as FIG. 2E.

Even though the conducting wires for electroplating the Ni/Au layer are not required in this case, the circuit layout pattern 25 (including electrical contact pads 26 and the electrically conducting traces) on each surface of the substrate 2 are coated with a Ni/Au layer, resulting in increasing fabrication cost since metal Ni/Au is very expensive. Furthermore, corresponding to the electrical contact pads 26 on the circuit layout pattern 25 on each surface of the substrate 2, only the top surface are covered with the Ni/Au 23, while the rest of the electrical contact pads 26 (including the side walls of the electrical contact pads serving as the bonding pads) are exposed without Ni/Au coverage. The exposed portions are corrosion due to oxidation, and the adhesion of bonding pads will be weak for lack of coverage with gold. Therefore, during the bonding process, electrodes on the chip and bonding pads on the substrate are bonded together by gold wires (not shown), the electrical coupling between gold wires and the bonding pads may be negative affected. Furthermore, the Ni/Au 23 on the circuit layout pattern 25 covered by the solder mask 27 (Illustrated as FIG. 2E) to prevent soldering on the top surface of the substrate 2 does not have reliable coupling due to lower adhesion between different materials resulting in poor yield.

Therefore, the present invention is to provide a substrate within a Ni/Au structure electroplated on electrical contact pads and a method for fabricating the same. The present invention does not necessary have additional conducting wires for electroplating process, so that the area occupied by the conducting wires for electroplating is decreased and the circuit layout area is increased. On the other hand, in the present invention, the electroplated contact pads are covered by Ni/Au, which facilitates the wire bonding process for packaged and the electrical contact pads to have excellent electrical interconnection performance, so as to improve the electrical coupling performance by means of reducing corrosion effect.

SUMMARY OF THE INVENTION

The major object of the present invention is to provide a method for fabricating a substrate within a Ni/Au structure electroplated on electrical contact pads. In this method, the conducting wires for electroplating are not necessary to be formed on the substrate, so that the effective area for circuit layout pattern is increased and the noise is thus reduced.

The other object of the present invention is to provide a method for fabricating a Ni/Au structure electroplated on electrical contact pads. In this method, it is not necessary for the circuit layout pattern to be coated with a Ni/Au layer, thus the fabrication cost is reduced.

Another object of the present invention is to provide a substrate within a Ni/Au structure electroplated on electrical contact pads, wherein the outer surface of said electrical contact pads are covered by a Ni/Au layer without any conducting wire formed for electroplating. It improves the electrical coupling between gold wires and the electrical contact pads of the substrate, prevents the electrical contact pads from oxidation, and insurances the electrical interconnection performance.

In order to achieve the foregoing objects, the present invention provides a substrate within a Ni/Au structure electroplated on electrical contact pads and a method for fabricating the same. According to one aspect of the present invention, the structure comprises: a substrate, having a circuit layout pattern; electrical contact pads formed on the circuit layout pattern; and a Ni/Au layer electroplated on said electrical contact pads; wherein there is no conducting wire formed for the Ni/Au structure electroplated on the electrical contact pads. Finally, a solder mask deposited on the substrate which has an opening to expose said electrical contact pads.

According to another aspect of the present invention, the method comprises the steps of:

(a) providing a substrate with a circuit layout pattern and forming an electrical conducting film on the surface of the substrate;

(b) depositing a first photoresist layer within an opening on the electrical conducting film surface to expose a portion of circuit layout pattern to be electrical contact pads;

(c) removing the exposed conducting film uncovered by the first photoresist layer;

(d) depositing a second photoresist layer, covering the conducting film exposed in the opening of the first photoresist layer;

(e) electroplating Ni/Au on at least one electrical contact pad, covering the surfaces of said electrical contact pads;

(f) removing the first and second photoresists, and the conducting film covered by the photoresists; and (g) depositing a solder mask on the substrate which has an opening to expose said electrical contact pads.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this invention and, together with the description, serve to explain the principles of the invention in general terms. Like numerals refer to like parts throughout the disclosure.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a substrate within a Ni/Au structure electroplated on electrical contact pads and a method for fabricating the same can be described hereinafter by the preferred embodiment. FIG. 3A to FIG. 3H show the fabrication process of a Ni/Au structure electroplated on electrical contact pads of a substrate according to the preferred embodiment of the present invention.

Figure 1:
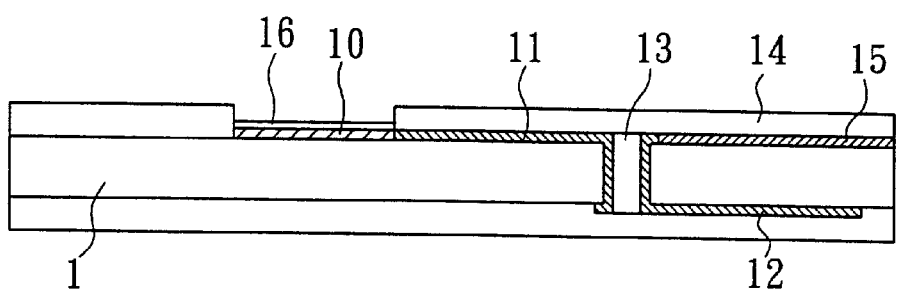
FIG. 1 is a schematic diagram illustrated a Ni/Au structure electroplated on electrical contact pads of a substrate in the prior art.
Figure 2A:
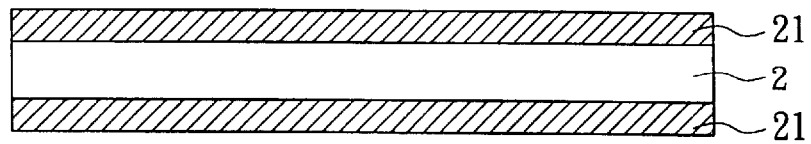
FIG. 2A to FIG. 2E illustrated the fabrication process of the other Ni/Au structure electroplated on electrical contact pads of a substrate in the prior art.
Figure 2B:
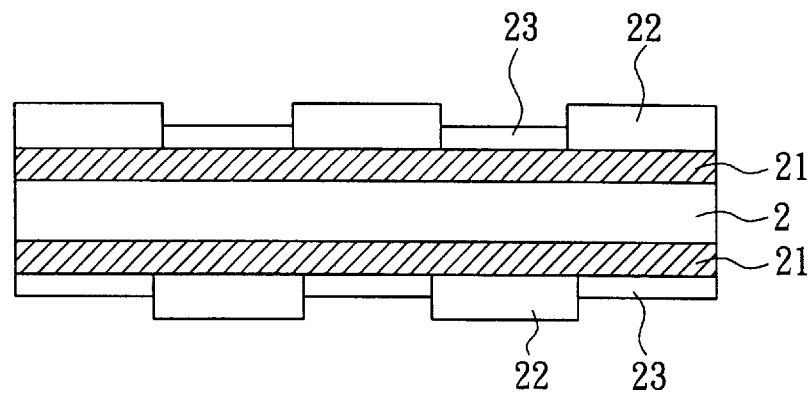
Figure 2C:
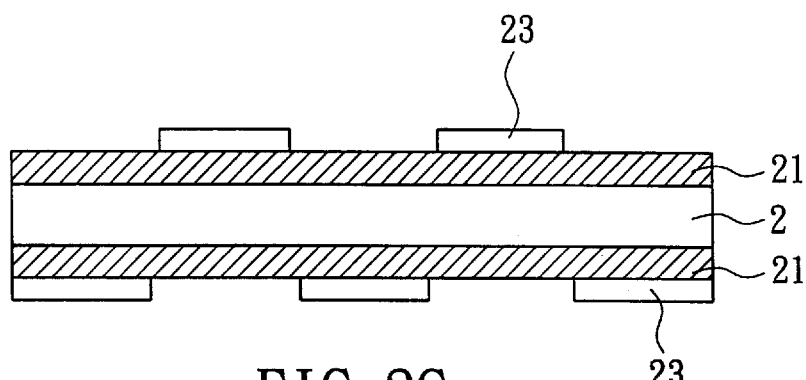
Figure 2D:
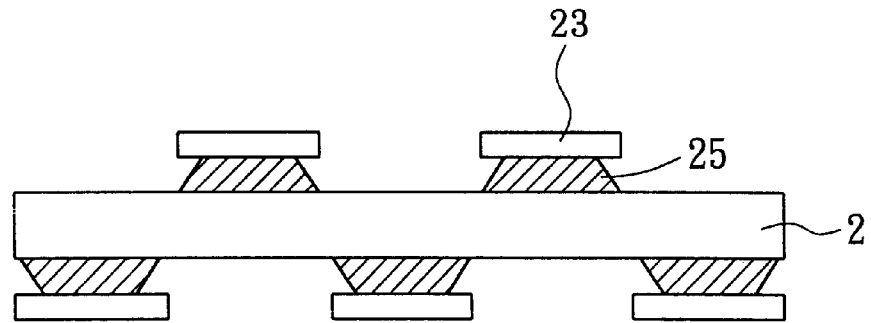
Figure 2E:
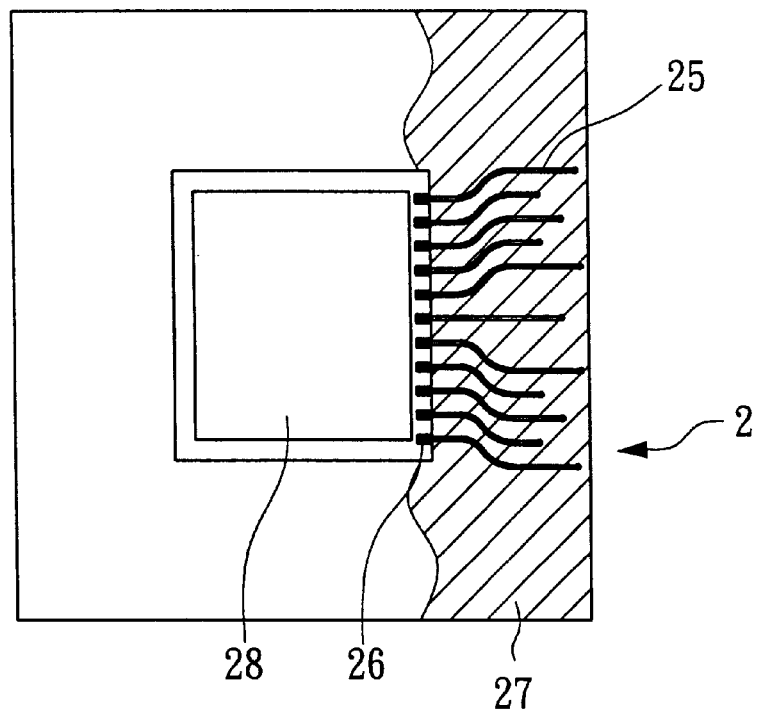
Figure 3A:
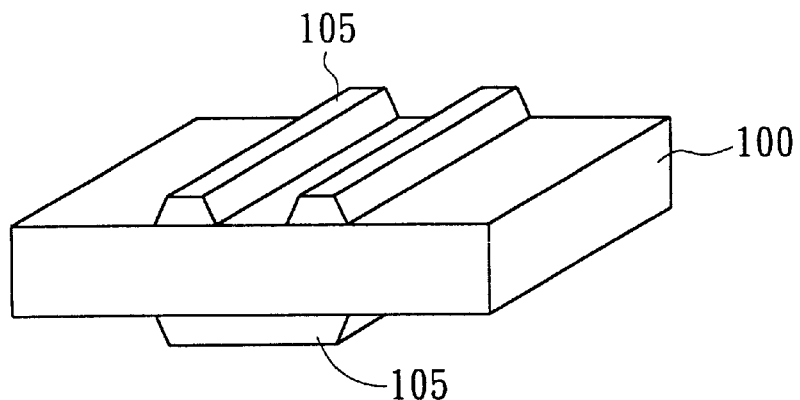
FIG. 3A to FIG. 3H illustrated the fabrication process of a Ni/Au structure electroplated on the electrical contact pads of a substrate in accordance with the preferred embodiment of the present invention.

Illustrated as FIG. 3A, providing a substrate 100 with plated through holes or blind vias. Then, a circuit layout pattern 105 is formed by photolithography and etching process.

Figure 3B:
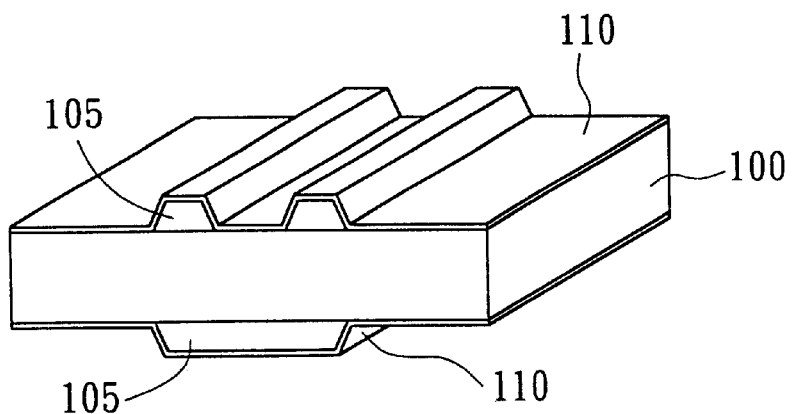

Illustrated as FIG. 3B, a conducting film 110 is composed of one of Sn, Cu, Cr, Pd, Ni, Sn/Pb and combination formed on the substrate 100 to be the conducting circuits for electroplating. Wherein the materials for forming the conducting film 110 are examples, don't limited to the foregoing materials in any practical application. By means of any electrically conducting metal formed within one of sputtering, electroless plating, physical deposition, and chemical deposition.

Figure 3C:
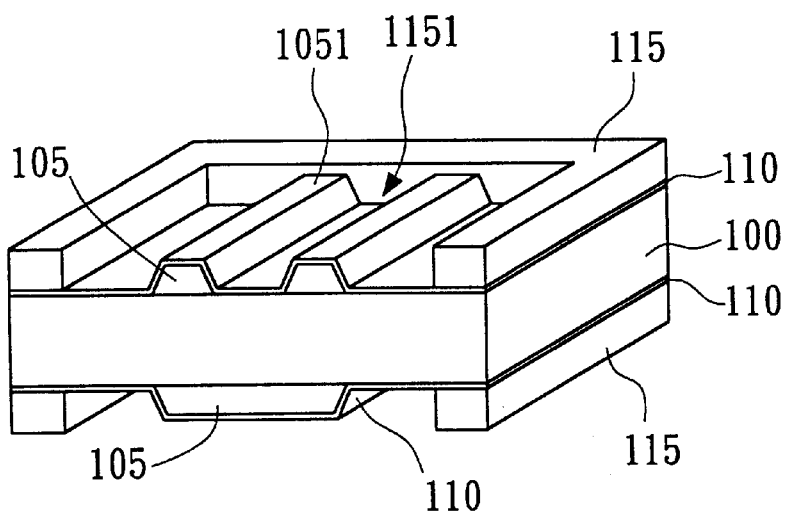

Illustrated as FIG. 3C, a first photoresist layer 115 is formed on the surface of the substrate covered with the conducting film 110. The first photoresist layer 115 has an opening 1151, wherein the exposed portion is the conducting film covering the circuit layout pattern to function as electrical contact pads portion, comprising at least one of electrical contact pads 1051.

Figure 3D:
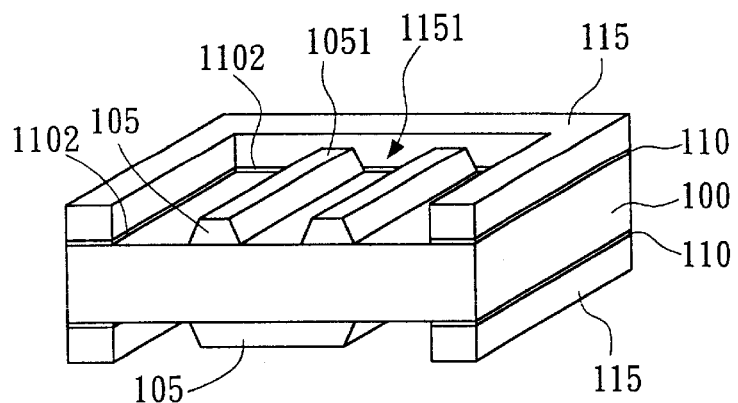

The uncovered portions of the conducting film 110 by the first photoresist layer 115 is removed by photolithography and etching, so that there is residual conducting film 1102 on the edge of the opening 1151 of photoresist, illustrated as FIG. 3D.

Figure 3E:
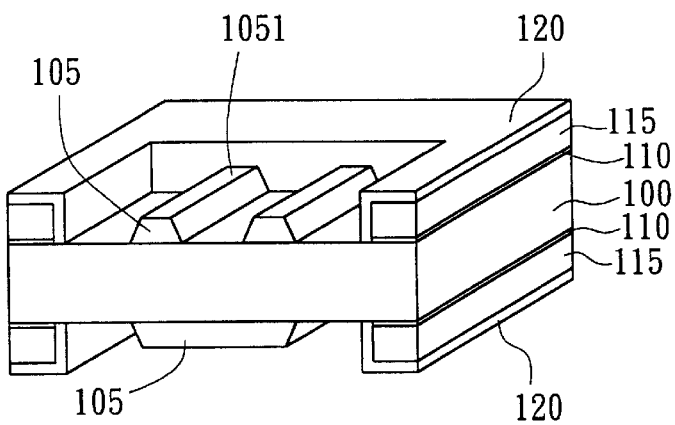
Figure 3F:
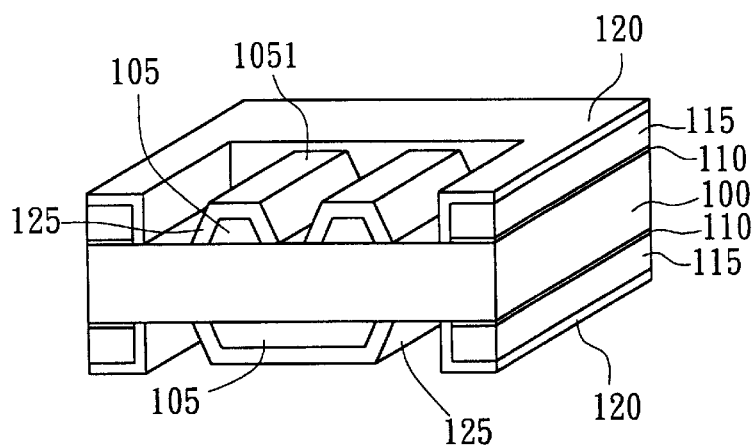
Figure 3G:
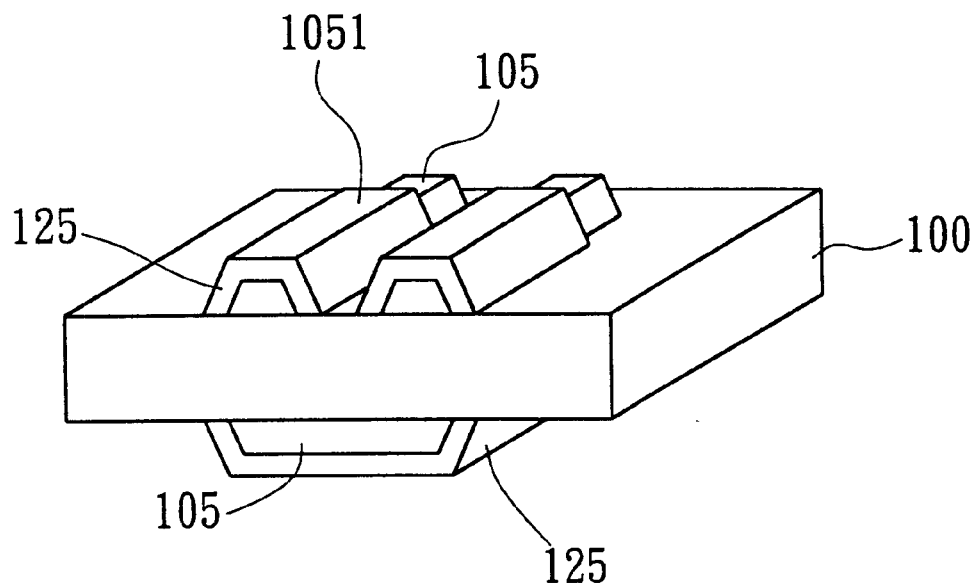

To prevent short-circuit formed in the circuit layout pattern after the Ni/Au electroplated process, a second photoresist layer 120 is deposited on the substrate 100 to cover the residual conducting film 1102 in the opening 1151 in the first photoresist layer 115, illustrated as FIG. 3E.

And then, Ni/Au is deposited onto the substrate 100 by electroplating process. The conducting film 110 is formed of a conducting material. Therefore, the Ni/Au layer 125 is electroplated onto the surface 1051 of said electrical contact pads by means of the conducting film 110, illustrated as FIG. 3F.

Furthermore, removing the second photoresist layer 120, the first photoresist layer 115 and the covered conducting film 100. Accordingly, the Ni/Au layer 125 is formed on said electrical contact pads 1051 of the substrate 100. The Ni/Au layer 125 is electroplated on the surface of said electrical contact pads 1051 of the circuit layout pattern 105, illustrated as FIG. 3G.

Figure 3H:
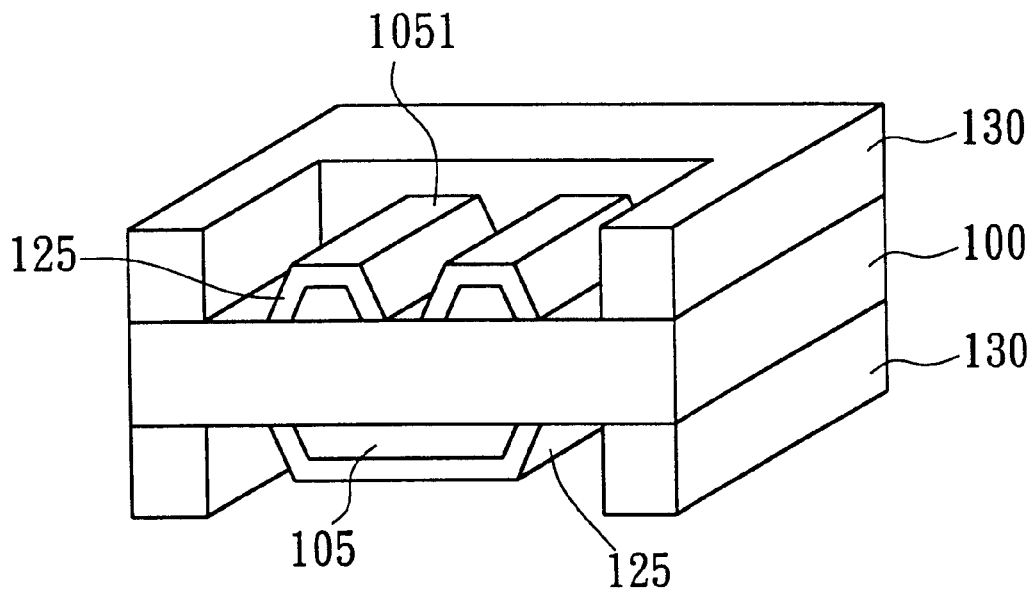

Finally, a solder mask 130 is deposited on the top surface of the substrate 100 to prevent soldering, which has an opening to expose said electrical contact pads electroplated a Ni/Au layer, illustrated as FIG. 3H.

The present invention relates to a Ni/Au structure electroplated on the electrical contact pads of a substrate. The electrical contact pads are used to be the bonding pads or solder ball pads for a substrate. Illustrated as the drawings, at least one of electrical contact pads 1051 are used as examples. In practical application, the number of electrical contact pads and the photoresist severed as mask are designed according to the fabrication process requirement. The process and the structure can be implemented on one or both sides on the substrate. In addition to the electrical contact pads according to the preferred embodiment of the present invention, any structure that implemented by Ni/Au electroplated can be realized as the method disclosed in that invention. Those who are skilled in this art should understand that the preferred embodiment is described to exemplify but not to limit the application of the present invention.

Summarizing, the present invention discloses a substrate within a Ni/Au structure electroplated on electrical contact pads and a method for fabricating the same, wherein a conducting film is used to provide the circuits to conduct the electrical contact pads on the substrate. Therefore, the fabrication cost is reduced by means of the additional conducting wire doesn't electroplated on the surface of the substrate. Furthermore, the occupied area of the conducting wires for electroplating is reduced resulting in the circuit layout density is increased, and the noise induced by the conducting wires for electroplating is eliminated. Also the present invention improves the electrical coupling between gold wires and the electrical contact pads of the substrate, prevents the electrical contact pads from oxidation, and insurances the electrical interconnection performance.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for fabricating the substrate within a Ni/Au structure electroplated on electrical contact pads, comprising the steps of:

(a) providing a substrate with a circuit layout pattern and forming an electrical conducting film on the surface of the substrate;

(b) depositing a first photoresist layer within an opening on said electrical conducting film surface to expose a portion of said circuit layout pattern to be electrical contact pads;

(c) removing the exposed conducting film uncovered by the first photoresist layer;

(d) depositing a second photoresist layer, covering said conducting film exposed in the opening of the first photoresist layer;

(e) electroplating a Ni/Au layer on said electrical contact pads; and (f) removing the first and second photoresists, and said conducting film covered by the photoresists.

2. The method for fabricating the substrate within a Ni/Au structure electroplated on electrical contact pads as claimed in claim 1, wherein there is a step (g) following the step (f): depositing a solder mask on said substrate within an opening to expose said electrical contact pads electroplated a Ni/Au layer thereon.

3. The method for fabricating the substrate within a Ni/Au structure electroplated on electrical contact pads as claimed in claim 2, wherein the electrical contact pads are one of bonding pads and solder ball pads.

4. The method for fabricating the substrate within a Ni/Au structure electroplated on electrical contact pads as claimed in claim 1, wherein the conducting film is composed of one of Sn, Cu, Cr, Pd, Ni, Sn/Pb and alloy thereof.

5. The method for fabricating the substrate within a Ni/Au structure electroplated on electrical contact pads as claimed in claim 1, wherein the conducting film is formed by means of one of sputtering, electroless plating, physical deposition, and chemical deposition.

* * * * *